(12) United States Patent
Chen et al.

(10) Patent No.: US 6,268,241 B1
(45) Date of Patent: Jul. 31, 2001

(54) METHOD OF FORMING A SELF-ALIGNED SILICIDE STRUCTURE IN INTEGRATED CIRCUIT FABRICATION

(75) Inventors: Hwi-Huang Chen; Gary Hong, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/408,152

(22) Filed: Sep. 29, 1999

(51) Int. Cl.$^7$ ................................................. H01L 21/8249
(52) U.S. Cl. ........................... 438/230; 438/229; 438/238
(58) Field of Search ..................................... 438/305, 230

(56) References Cited

U.S. PATENT DOCUMENTS

| | | | | |
|---|---|---|---|---|
| 5,536,684 | * | 7/1996 | Dass et al. | 437/201 |
| 5,554,566 | * | 9/1996 | Lur et al. | 437/193 |
| 5,604,157 | * | 2/1997 | Dai et al. | 438/200 |
| 5,907,789 | * | 5/1999 | Komatsu | 438/649 |
| 5,920,763 | * | 7/1999 | Schuegraf | 438/3 |
| 5,998,247 | * | 12/1999 | Wu | 438/200 |
| 5,998,284 | * | 12/1999 | Azuma | 438/514 |
| 6,030,867 | * | 2/2000 | Chien et al. | 438/255 |
| 6,037,220 | * | 3/2000 | Chien et al. | 438/255 |
| 6,046,084 | * | 4/2000 | Wei et al. | 438/255 |
| 6,096,595 | * | 8/2000 | Huang | 438/238 |
| 6,097,055 | * | 8/2000 | Lee et al. | 257/309 |
| 6,117,723 | * | 9/2000 | Huang | 438/238 |

* cited by examiner

Primary Examiner—John F. Niebling
Assistant Examiner—Olivia T Luk

(57) ABSTRACT

A method for forming a self-aligned silicide (or called salicide) structure in IC fabrication is described. This method is characterized by the step of making the top surface of a polysilicon-based structure into a rugged surface, which allows the subsequently formed salicide structure over the rugged surface of the polysilicon-based structure to have an increased surface area and thus have a reduced sheet resistance when compared to the prior art. By this method, the first step is to prepare a semiconductor substrate, after which an oxide layer is formed over the substrate. Next, a polysilicon-based structure is formed over the oxide layer, and then the exposed surface of the polysilicon-based structure is reshaped into a rugged surface. Subsequently, a silicide layer is formed over the rugged surface of the polysilicon-based structure, which serves as the intended salicide structure.

12 Claims, 4 Drawing Sheets

METHOD OF FORMING A SELF-ALIGNED SILICIDE STRUCTURE IN INTEGRATED CIRCUIT FABRICATION

BACKGROUND OF THE INVENTION

1. Field of the Invention

This invention relates to integrated circuit (IC) fabrication technology, and more particularly, to a method of forming a self-aligned silicide (also called salicide) structure in IC fabrication.

2. Description of the Related Art

As IC fabrication technologies advance to the submicron level of integration, the semiconductor components in the ICs are now fabricated having very small line widths, contact surfaces, and junction depths. When a polysilicon-based structure is downsized, it will undesirably result in an increase in resistance since the resistance is proportional to the cross sectional area. As a consequence, all the RC delay circuits in the IC device are increased in time constant, thus undesirably providing an increased RC delay.

One solution to the foregoing problem is to use the so-called salicide (acronym for self-aligned silicide) technology to form a salicide structure over the polysilicon-based structure, which can help increase the conductivity. The salicide structure can be self-aligned to the predefined locations and dimensions without the use of photolithography. Conventionally, titanium silicide (TiSi$_x$) is the semiconductor material most widely utilized to form a salicide structure.

FIGS. 1A–1D are schematic diagrams used to depict the steps involved in a conventional method for forming a salicide structure in an IC device Referring first to FIG. 1A, in the first step, a semiconductor substrate 100 is prepared. This substrate 100 is then formed with a plurality of isolation structures 102 at predefined locations. Next, a MOS structure is formed within the area defined by the isolation structures 102 over the substrate 100, which includes a gate oxide layer 104, a polysilicon-based gate structure 106, a pair of source/drain regions 110, and a sidewall-spacer structure 108.

Referring next to FIG. 1B, in the subsequent step, a sputtering process is performed to form a metallization layer 112 over the entire top surface of the wafer, covering all the exposed surfaces of the source/drain regions 110 and the polysilicon-based gate structure 106. This metallization layer 112 can be formed, for example, from tungsten.

Referring further to FIG. 1C, in the subsequent step, an RTP (Rapid Thermal Process) is performed on the wafer to cause the metal atoms in the metallization layer 112 to react with the silicon atoms in the source/drain regions 110 and the polysilicon-based gate structure 106. As a result of this process, silicide layers 114 are formed at the contact surface between the metallization layer 112 and the source/drain regions 110 as well as at the contact surface between the metallization layer 112 and the polysilicon-based gate structure 106.

Referring next to FIG. 1D, in the subsequent step, a wet-etching process is performed to remove all the unreacted part of the metallization layer 112 (FIG. 1C) until the silicide layers 114 are exposed. Since these silicide layers 114 can be aligned to the intended locations without the use of photolithography, they are customarily referred to as a self-aligned silicide structure, or a salicide structure.

As the fabrication advances to the submicron level of integration, however, the polysilicon-based gate structure 106 is reduced to a very small size. This results in an increased stress and a reduced nucleation site for the salicide structure 114 formed over the polysilicon-based gate structure 106. This, in turn, undesirably causes a change in the content of the silicon atoms in the silicide; i.e., the value of x in TiSi$_x$ is changed, resulting in an undesired increase to the sheet resistance of the salicide structure. As a consequence, the performance of the overall IC device is degraded.

SUMMARY OF THE INVENTION

It is therefore an objective of this invention to provide a new method for forming a salicide structure in IC fabrication, which can help reduce the sheet resistance of the resulting salicide structure.

It is another objective of this invention to provide a new method for forming a salicide structure in IC fabrication, which can help increase the contact surface of the polysilicon-based structure so that the salicide structure formed thereon can be increased in dimension.

In accordance with the foregoing and other objectives, the invention proposes a new method for forming a salicide structure in IC fabrication. The method of the invention includes the following steps: (1) preparing a semiconductor substrate; (2) forming an oxide layer over the substrate; (3) forming a polysilicon-based structure over the oxide layer; (4) making the exposed surface of the polysilicon-based structure into a rugged surface; and (5) forming a silicide layer over the rugged surface of the polysilicon-based structure, the silicide layer serving as the intended salicide structure.

The foregoing method of the invention is characterized by the step of making the top surface of the polysilicon-based structure into a rugged surface, which allows the subsequently formed salicide structure over the rugged surface of the polysilicon-based structure to have an increased surface area and thus have a reduced sheet resistance when compared to the prior art. The rugged surface of the polysilicon-based structure can be formed either by etching the exposed surface of the polysilicon-based structure with phosphoric acid, or by forming an HSG-Si (Hemispherical Grain Silicon) layer over the exposed surface of the polysilicon-based structure.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method according to the invention for forming a salicide structure in an IC device is disclosed in full detail by the following with reference to FIGS., 2A–2F.

Figure 1A:
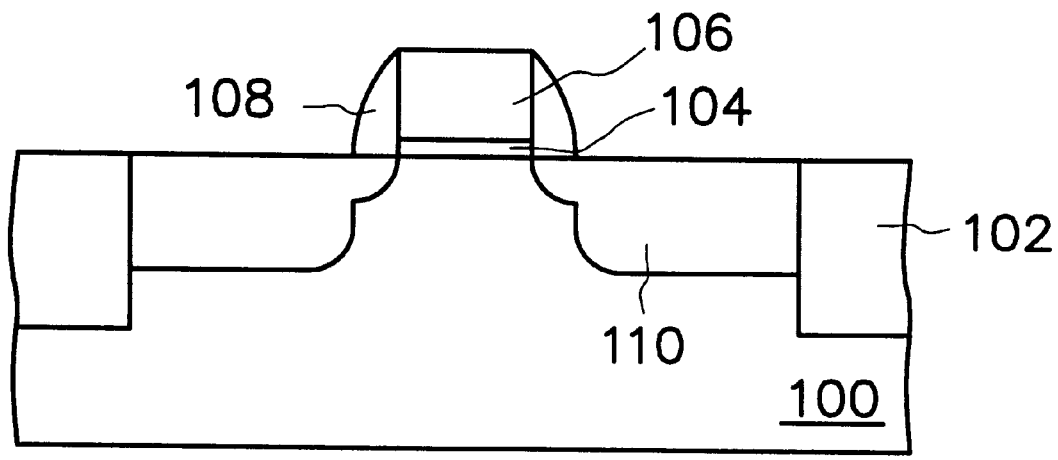
FIGS. 1A–1D (PRIOR ART) are schematic diagrams used to depict the steps involved in a conventional method for forming a salicide structure in IC fabrication.
Figure 1B:
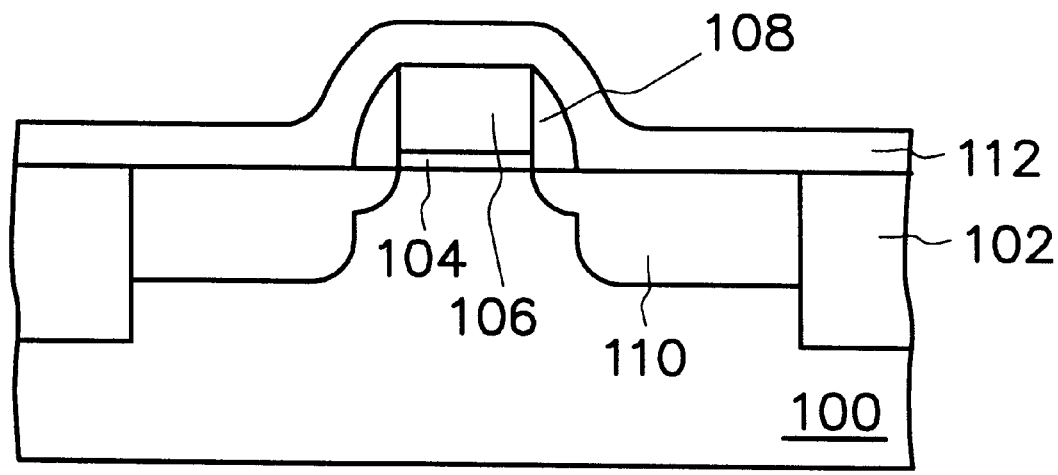
Figure 1C:
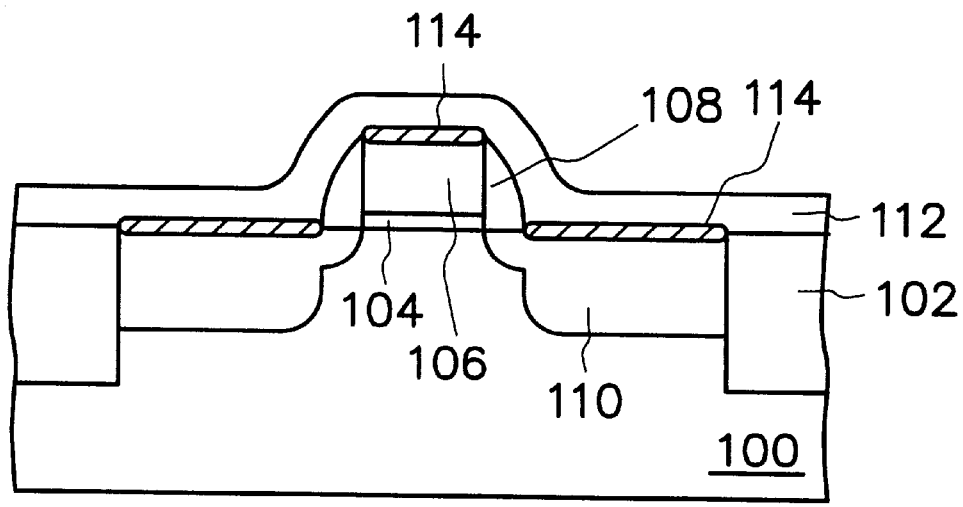
Figure 1D:
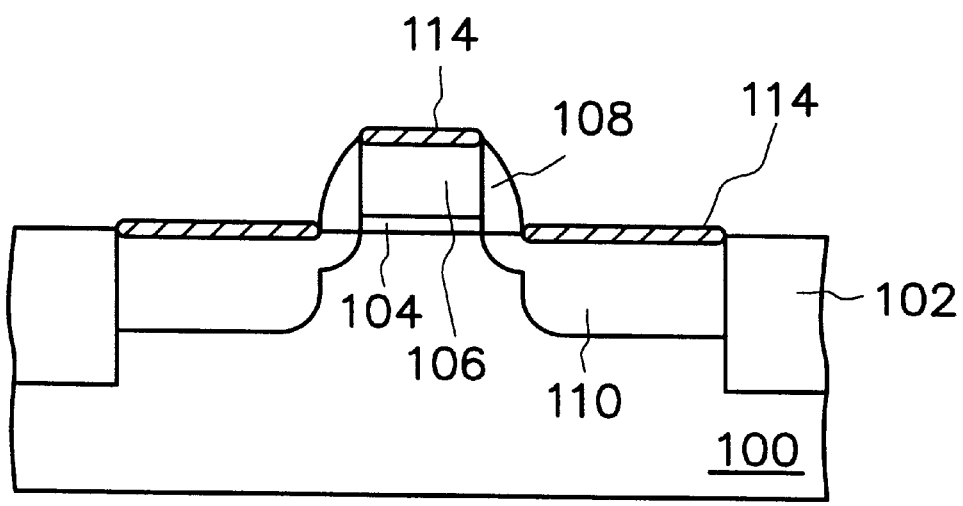
Figure 2A:
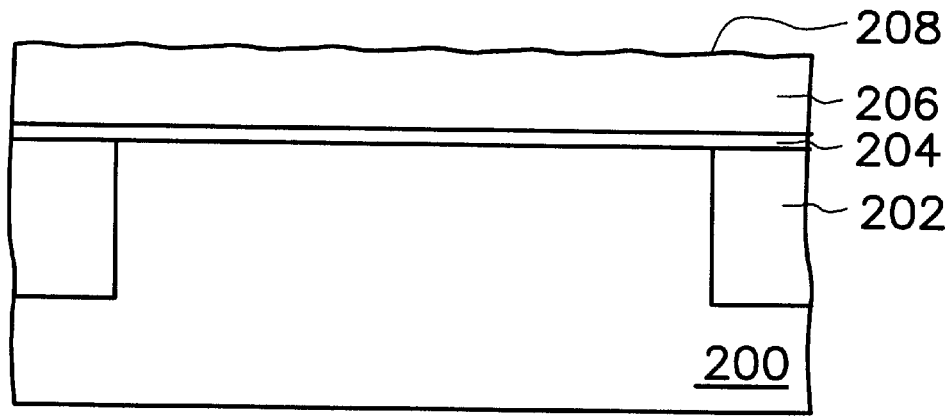
FIGS. 2A–2F are schematic diagrams used to depict the steps involved in the method of the invention for forming a salicide structure in IC fabrication.

Referring first to FIG. 2A, in the first step, a semiconductor substrate 200 is prepared. An oxide layer 204 is then formed over the entire top surface of the substrate 200 through, for example, a thermal oxidation process. Next, a polysilicon layer 206 is formed over the entire top surface of the oxide layer 204 through, for example, a CVD (Chemical-Vapor Deposition) process.

It is a characteristic feature of invention that, in the next step, the top surface of the polysilicon layer 206 is shaped into a rugged surface 208. This can be achieved by using an acidic etchant, such as hot phosphoric acid, to etch the top surface of the polysilicon layer 206 to make it rugged. Alternatively, the ruggedness can be achieved by forming a thin HSG-Si (Hemispherical Grain Silicon) layer over the polysilicon layer 206. The HSG-Si layer can be formed either by depositing HSG-Si over the polysilicon layer 206 through a CVD process, or by first forming an amorphous silicon layer over the polysilicon layer 206, and then annealing the amorphous silicon into HSG-Si.

Figure 2B:
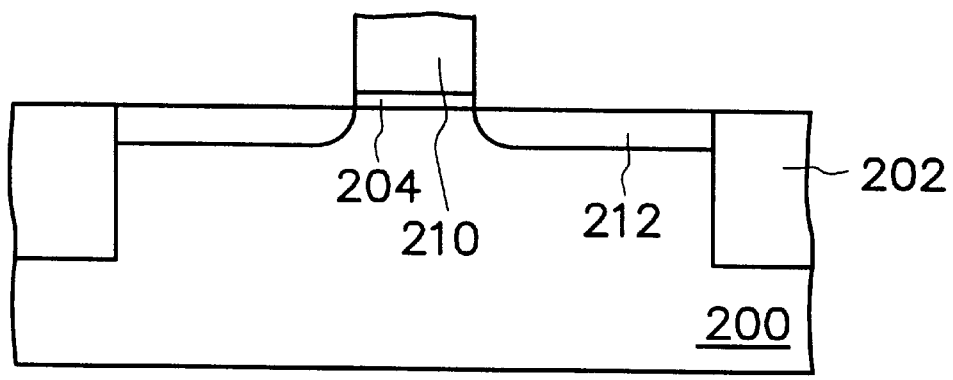

Referring next to FIG. 2B, in the subsequent step, a selective removal process, such as a photolithographic and etching process, is performed to remove selected portions of the polysilicon layer 206 (FIG. 2A) and the oxide layer 204 (FIG. 2A), with the remaining part of the polysilicon layer 206 (FIG. 2A), here designated by the reference numeral 210, serving as a bit line. After this, with the bit line structure 210 serving as mask, an ion-implantation process is performed on the wafer so as to dope an impurity element into the unmasked portions of the substrate 200, whereby an LDD (Lightly-Doped Drain) 212 is formed in the substrate 200.

Figure 2C:
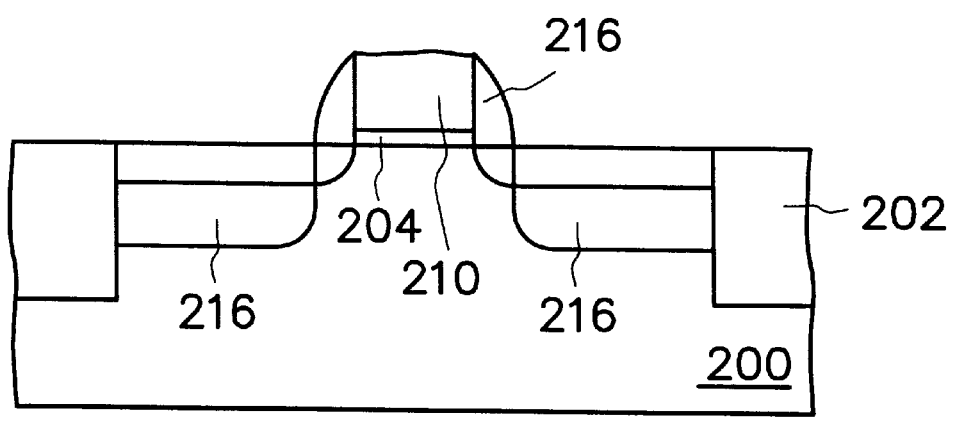

Referring further to FIG. 2C, in the subsequent step, a sidewall-spacer structure 214 is formed on the sidewall of the bit line 210 and the oxide 204. After this, with the sidewall-spacer structure 214 serving as mask, an ion-implantation process is performed on the wafer so as to dope an impurity element into and beyond the LDD 212 (FIG. 2B), whereby a plurality of source/drain regions 216 are formed in the substrate 200.

Figure 2D:
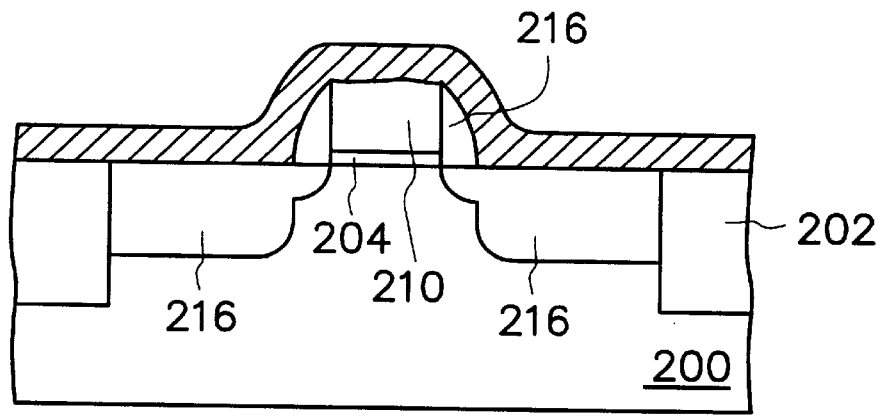

Referring next to FIG. 2D, in the subsequent step, a metallization 218 is formed over the entire top surface of the wafer, which metal 218 covers the bit line 210, the sidewall-spacer 214, and the source/drain regions 216. This metallization 218 can be formed, for example, from tungsten through a sputtering process.

Figure 2E:
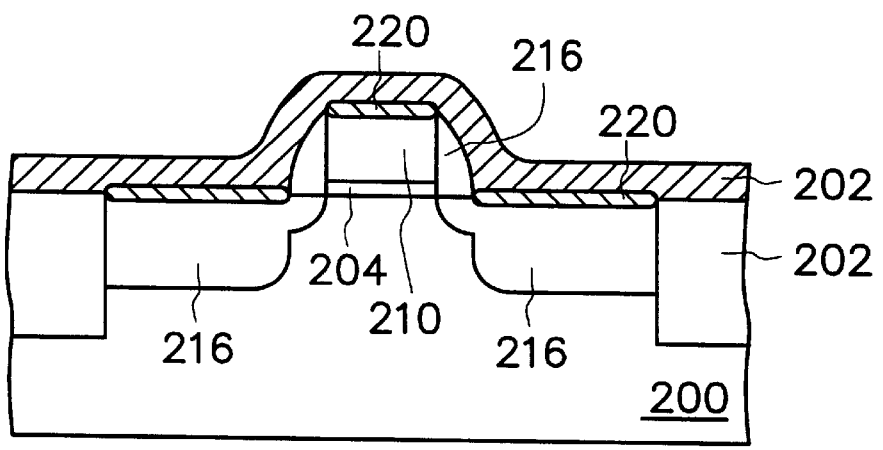

Referring further to FIG. 2E, in the subsequent step, an RTP (Rapid Thermal Process) is performed on the wafer to cause the metal atoms in the metallization 218 to react with the silicon atoms in the source/drain regions 216 and the bit line 210. As a result of this process, silicide layers 220 are formed at the contact surface between the metallization 218 and the source/drain regions 216 as well as at the contact surface between the metallization 218 and the bit line 210. Due to the bit line 210 having a rugged surface 208 (see FIG. 2A), the resulting silicide 220 on the bit line 210 can be formed with a larger surface area, thus resulting in a reduced sheet resistance when compared to the prior art.

Figure 2F:
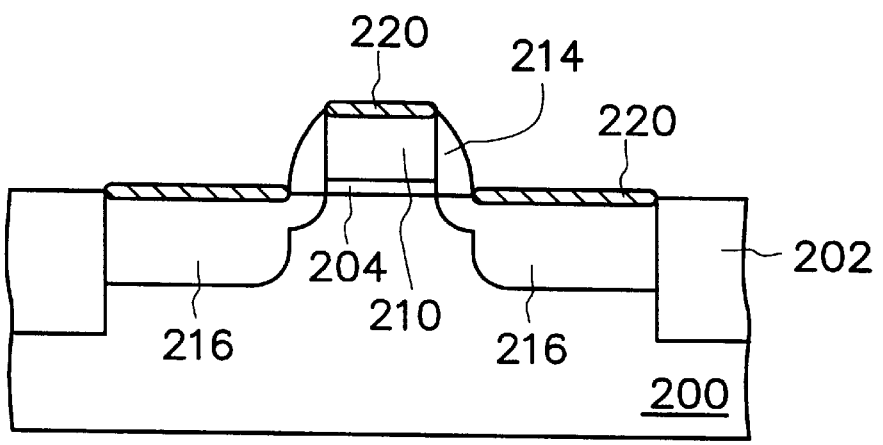

Referring to FIG. 2F, in the subsequent step, a wet-etching process is performed to remove all the unreacted parts of the metallization 218 (FIG. 2E) until all the silicide layers 220 are exposed. The silicide layers 220 then serve as the intended salicide structure.

In conclusion, the method of the invention is characterized by the step of forming the polysilicon-based bit line 210 with a rugged surface 208, thereby allowing the subsequently formed silicide 220 over the rugged surface 208 of the bit line 210 to have an increased surface area and thus have a reduced sheet resistance when compared to the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a salicide structure in IC fabrication, comprising the steps of:

preparing a semiconductor substrate;

forming an oxide layer over the substrate;

forming a polysilicon-based layer over the oxide layer;

forming a rugged surface on a top surface of the polysilicon-based layer;

patterning the rugged surfaced polysilicon-based layer and the oxide layer to form a gate structure; and forming a silicide layer over the rugged surface of the polysilicon-based layer, the silicide layer serving as the salicide structure.

2. The method of claim 1, wherein the rugged surface of the polysilicon-based structure is formed by etching the exposed surface of the polysilicon-based structure with phosphoric acid.

3. The method of claim 1, wherein the rugged surface of the polysilicon-based structure is formed by forming a hemispherical grained silicon (HSG-Si) layer over the exposed surface of the polysilicon-based structure.

4. The method of claim 1, wherein the step of forming the silicide layer includes the substeps of:

forming a metallization layer over the rugged surface of the polysilicon-based structure;

performing a rapid thermal process (RTP) to cause the metal atoms in the metallization layer to react with the silicon atoms in the polysilicon-based structure; and removing the unreacted part of the metallization layer.

5. The method of claim 1, further comprising, between steps (4) and (5), the steps of:

performing a selective removal process to remove selected portions of the polysilicon-based structure and the oxide layer, with the remaining portions thereof serving as a bit line structure;

with the bit line structure serving as mask, performing a first ion-implantation process to dope an impurity element into unmasked portions of the substrate so as to form a lightly doped drain (LDD) structure in the substrate;

forming a sidewall-spacer structure on a sidewall of the bit line structure; and with the sidewall-spacer structure and the bit line structure serving as mask, performing a second ion-implantation process to dope an impurity element into unmasked portions of the substrate so as to form a source/drain structure in the substrate.

6. The method of claim 5, further comprising the steps of:

forming a metallization layer over the bit line structure and the source/drain structure;

performing a RTP to cause the metal atoms in the metallization layer to react with the silicon atoms in the polysilicon-based structure; and removing the unreacted part of the metallization layer.

7. The method of claim 1, wherein the silicide layer is a layer of tungsten silicide.

8. A method for forming a salicide structure in IC fabrication, comprising the steps of:

preparing a semiconductor substrate;

forming a bit line structure including an oxide layer over the substrate and a polysilicon-based layer over the oxide layer;

forming a rugged surface on a top surface of the polysilicon-based layer;

with the bit line structure serving as mask, performing a first ion-implantation process to dope an impurity element into unmasked portions of the substrate so as to form an LDD structure in the substrate;

forming a sidewall-spacer structure on a sidewall of the bit line structure;

with the sidewall-spacer structure and the bit line structure serving as mask, performing a second ion-implantation process to dope an impurity element into the unmasked portions of the substrate so as to form a source/drain structure in the substrate; and forming suicide layers over the rugged surface of the polysilicon-based layer and exposed surfaces of the source/drain structure, the silicide layers serving as the intended salicide structure.

9. The method of claim 8, wherein the rugged surface of the polysilicon-based structure is formed by etching the exposed surface of the polysilicon-based structure with phosphoric acid.

10. The method of claim 8, wherein the rugged surface of the polysilicon-based structure is formed by forming a HSG-Si layer over the exposed surface of the polysilicon-based structure.

11. The method of claim 8, wherein the step of forming the silicide layers includes the substeps of:

forming a metallization layer over the bit line structure and the source/drain structure;

performing a RTP to cause the metal atoms in the metallization layer to react with the silicon atoms in the polysilicon-based structure; and removing the unreacted part of the metallization layer.

12. The method of claim 11, wherein the metallization layer is formed from tungsten.

* * * * *